US006855617B1

(12) United States Patent
Lu et al.

(10) Patent No.: US 6,855,617 B1
(45) Date of Patent: Feb. 15, 2005

(54) METHOD OF FILLING INTERVALS AND FABRICATING SHALLOW TRENCH ISOLATION STRUCTURES

(75) Inventors: Chien-Hung Lu, Hsinchu (TW); Chin-Ta Su, Yunlin (TW); Kuang-Chao Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/707,083

(22) Filed: Nov. 20, 2003

(51) Int. Cl.[7] ............................................... H01L 21/76
(52) U.S. Cl. ........................ 438/435; 438/424; 438/421; 438/404; 438/405
(58) Field of Search ........................ 438/435, 404–405, 438/421, 424

(56) References Cited

U.S. PATENT DOCUMENTS 5,741,740 A * 4/1998 Jang et al. ................... 438/435
5,902,127 A * 5/1999 Park ............................. 438/435
6,214,698 B1 * 4/2001 Liaw et al. .................. 438/435
6,653,203 B1 * 11/2003 Huang et al. ................ 438/435

* cited by examiner

Primary Examiner—Luan Thai
(74) Attorney, Agent, or Firm—Jianq Chyun IP Office

(57) ABSTRACT

A method of filling intervals between protruding structures is provided. A substrate with a plurality of protruding structures thereon is provided. The protruding structures are distributed over the substrate such that intervals are formed between adjacent protruding structures. A first dielectric layer is formed over the substrate so that the dielectric material fills the intervals between the protruding structures and covers the protruding structures as well. The first dielectric layer has a plurality of apertures therein located at a level above a top section of the protruding structures. A chemical/mechanical polishing operation is performed to remove a portion of the dielectric layer and expose the apertures to form a plurality of openings. An anisotropic etching operation is performed to increase the width of these openings. Finally, a second dielectric layer is formed over the first dielectric layer to fill the openings completely.

22 Claims, 3 Drawing Sheets

METHOD OF FILLING INTERVALS AND FABRICATING SHALLOW TRENCH ISOLATION STRUCTURES

BACKGROUND OF INVENTION

1. Field of the Invention

The present invention relates to a semiconductor process. More particularly, the present invention relates to a method of filling intervals and fabricating shallow trench isolation structures.

2. Description of the Related Art

In semiconductor manufacturing, devices are connected through conductive lines. In addition, a via plug is used to connect an integrated circuit device to a conductive line or the conductive lines in two different layers. To prevent a short circuit due to a direct contact, a dielectric layer or inter-metal dielectric (IMD) layer is interposed between a conductive line and a semiconductor device or between an upper conductive line and a lower conductive line (except for the place with via plugs).

However, with an increase in the level of integration of semiconductor devices, size of each device shrinks so that the aspect ratio of the intervals between conductive lines increases significantly. Thus, filling the intervals between conductive lines with a dielectric material has become increasingly difficult. Furthermore, as the distance of separation between conductive lines is reduced, resistivity of the conductive line and the size of parasitic capacitance are critical factors in determining the speed of the device. To provide a sufficiently fast operating speed for a shrunken semiconductor device, the dielectric material isolating the conductive lines must meet some property requirements. The dielectric material not only must fill the intervals between the conductive lines completely, but also must have superior planarizing capacity. In addition, the dielectric material must also prevent the percolation of moisture and have a low dielectric constant to minimize parasitic capacitance between neighboring conductive lines.

Typically, a high density plasma chemical vapor deposition (HDPCVD) process produces a compact dielectric layer with both moisture blocking capacity and planarity superior to another dielectric layer formed by other chemical vapor deposition process. Hence, the HDPCVD process is the principal method of depositing oxide material to fill intervals. However, as the level of integration of integrated circuit devices continues to increase, the aspect ratio of the interval between neighboring conductive lines also increases correspondingly. Under such circumstance, even the HDPCVD process can hardly fill the intervals completely so that voids are frequently formed within the dielectric layer leading to a drop in the overall production yield.

Aside from an incomplete filling of intervals by the dielectric material layer, the same problem occurs in the fabrication of shallow trench isolation structures as well. As the level of integration increases, each active region must occupy a smaller area. Hence, the shallow trench isolation structures between the active regions must also be reduced. In other words, the aspect ratio of the trench for forming the shallow trench isolation structure is reduced so much that even a HDPCVD process can hardly fill the trench with dielectric material. Since the yield in subsequent processes is likely to be affected by any voids inside the dielectric layer, researchers are constantly on the lookout for a simple method for completely filling the intervals (or trenches) with dielectric material.

SUMMARY OF INVENTION

Accordingly, at least one object of the present invention is to provide a method of filling intervals capable of resolving the problem of failing to completely fill the intervals with dielectric material using a high density plasma chemical vapor deposition in a conventional method.

At least a second object of this invention is to provide a method of fabricating shallow trench isolation structures capable of resolving the problem of failing to completely fill the trenches with a dielectric material in a convention method so that voids are created within the dielectric material layer.

To achieve these and other advantages and in accordance with the purpose of the invention, as embodied and broadly described herein, the invention provides a method of filling intervals. First, a substrate with a plurality of protruding structures, for example, device structures thereon is provided. The device structures are distributed over the substrate such that intervals are formed between each other. Thereafter, a first dielectric layer is formed over the substrate so that the dielectric material fills the intervals between the device structures and covers the device structures as well. The first dielectric layer also has a plurality of apertures therein located at a level above the top section of the device structures. A chemical/mechanical polishing operation is performed to remove a portion of the dielectric layer and expose the apertures to form a plurality of openings. An anisotropic etching operation is performed to increase the width of these openings. Finally, a second dielectric layer is formed over the first dielectric layer to fill the openings completely.

This invention also provides an alternative method of filling intervals. First, a substrate having at least a first opening thereon is provided. Thereafter, a first dielectric layer is formed over the substrate to fill the first opening and cover the substrate. The first dielectric layer has at least an aperture located above the first opening at a level higher than the top surface of the substrate. A portion of the first dielectric layer is removed to open the aperture and form a second opening. The first dielectric layer on the sidewalls of the second opening is removed to increase the width of the second opening. Finally, a second dielectric layer is formed over the first dielectric layer to fill the second opening completely.

In this invention, a chemical/mechanical polishing operation is performed to open the apertures within the first dielectric layer after the first dielectric layer is formed. Furthermore, an anisotropic etching operation is performed to increase the width of the openings (or the second openings). Thus, the openings (or the second openings) can be completely filled when the second dielectric layer is formed over the first dielectric layer. Ultimately, all the intervals (or the first opening) between various device structures are completely filled with dielectric material.

This invention also provides a method of fabricating shallow trench isolation structures. First, a substrate having a patterned pad oxide layer, a mask layer and a plurality of trenches is provided. Thereafter, a first dielectric layer is formed over the mask layer to fill the trenches. The first dielectric layer has a plurality of apertures with their top section at a level higher than the upper surface of the mask layer. A portion of the first dielectric layer is removed to open up the apertures and form a plurality of openings. A portion of the first dielectric material at the sidewalls of the opening is removed to increase the width of the openings. A second dielectric layer is formed over the first dielectric layer to fill the openings. Finally, the first dielectric layer and the second dielectric layer outside the trenches are removed.

In the process of fabricating the shallow trench isolation structures, the apertures inside the first dielectric layer are opened up to form openings and these openings are subsequently widened. Thus, when the second dielectric layer is formed over the first dielectric layer, the openings are completely filled to form shallow trench isolation structures that are free of voids.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
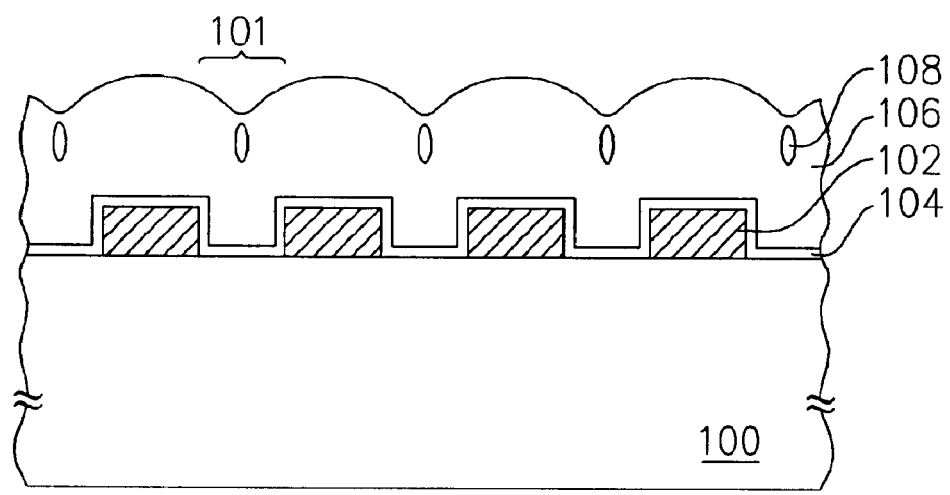
FIGS. 1A through 1C are schematic cross-sectional views showing the steps for filling intervals according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
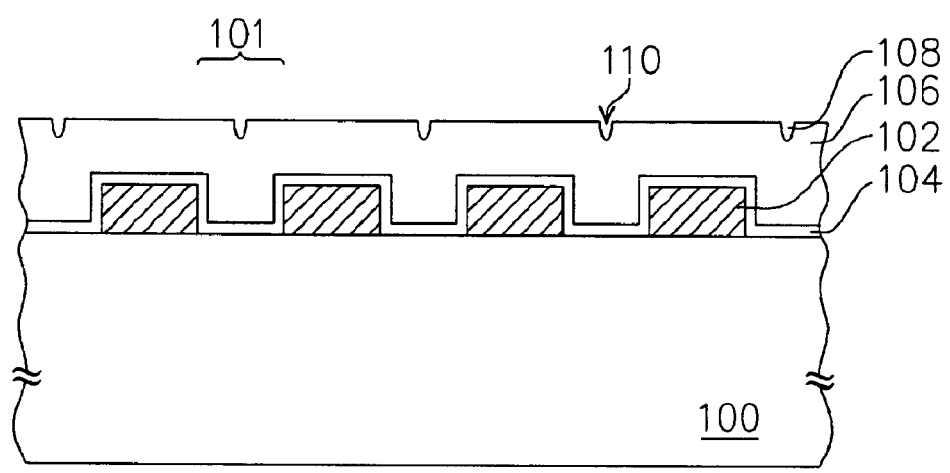
Figure 1C:
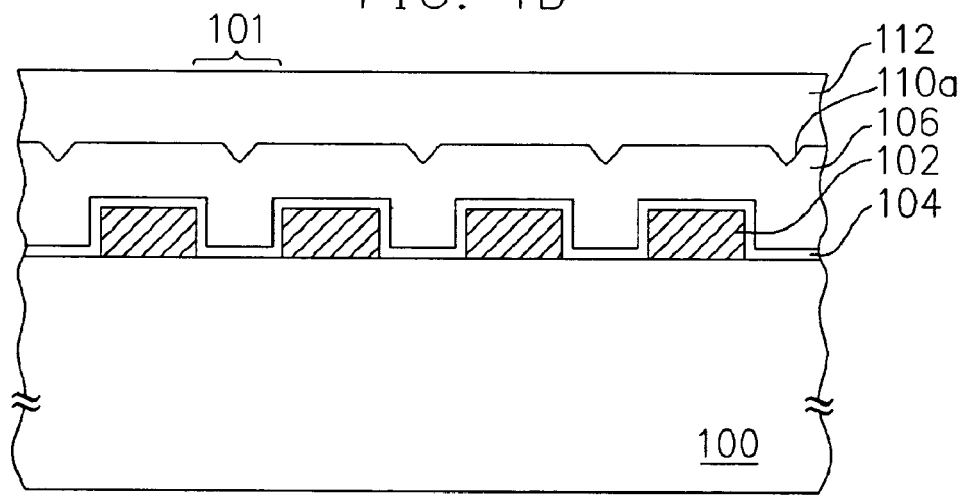

FIGS. 1A through 1C are schematic cross-sectional views showing the steps for filling intervals according to one preferred embodiment of this invention. As shown in FIG. 1A, a substrate 100 having a plurality of device structures 102 thereon is provided. The device structures 102 are separated from each other by intervals 101. In one embodiment of this invention, the device structures 102 are conductive line structures, for example. These conductive line structures can be fabricated from different types of materials including, for example, aluminum-copper-aluminum silicon alloy or aluminum-copper alloy or copper. In another embodiment of this invention, the device structures 102 can be gate structures, transistors, diodes or other semiconductor device structures, for example.

A liner layer 104 is formed over the device structures 102 and the substrate 100. The liner layer 104 is, for example, a silicon oxide layer formed by performing a chemical vapor deposition (CVD) process. The liner layer 104 serves to reduce the aspect ratio of the intervals between neighboring device structures 102. Thereafter, a dielectric layer 106 is formed over the substrate 100 to fill the intervals 101 between various device structures 102 and cover the device structures 102. The dielectric layer 106 has a plurality of apertures 108 located at a level higher than the top section of the device structures 102. The dielectric layer 106 is, for example, a silicon oxide layer formed by performing a high-density plasma chemical vapor deposition (HDP-CVD) process. Note that there is no particular restriction on the type of reactive gases or inert gases and the applied bias voltage in the HDP-CVD process as long as the apertures 108 are set up at a level higher than the top section of the device structures 102. In one preferred embodiment, the reactive gases are silane and oxygen and the inert gas is argon.

As shown in FIG. 1B, a chemical/mechanical polishing (CMP) operation is performed to remove a portion of the dielectric layer 106 and open up the apertures 108 to form a plurality of openings 110. Since the apertures 108 are located in a position higher than the top section of the device structures 102, the apertures 108 are opened up without damaging the device structures 102 after the CMP operation.

As shown in FIG. 1C, an anisotropic etching process is performed to increase the width of the openings 110. The anisotropic etching process is, for example, a wet etching operation using an etchant such as hydrofluoric (HF) acid solution. The purpose of widening the openings 110 to form openings 110a is to increase the aspect ratio of the openings 110. Thereafter, another dielectric layer 112 is formed over the dielectric layer 106 to fill the openings 110a. The dielectric layer 112 is, for example, a silicon oxide layer formed by performing a chemical vapor deposition process using tetra-ethyl-ortho-silicate (TEOS) as the reactive gas. Note that the dielectric material is able to fill the openings 110a on the dielectric layer 106 completely because the aspect ratio of the openings 110a is reduced.

In this invention, a chemical/mechanical polishing operation is performed to open the apertures 108 within the dielectric layer 106 after the dielectric layer 106 is formed. Furthermore, an anisotropic etching operation is performed to increase the width of the opening 110. Thus, the openings 110a can be completely filled when the dielectric layer 112 is formed over the dielectric layer 106. Therefore, all the intervals 101 between various device structures 102 are completely filled with dielectric material.

In addition, the aforementioned method can be applied to fill the intervals of various other types of device structures including, for example, gate structures, transistors, diodes or other semiconductor device structures.

Figure 2A:
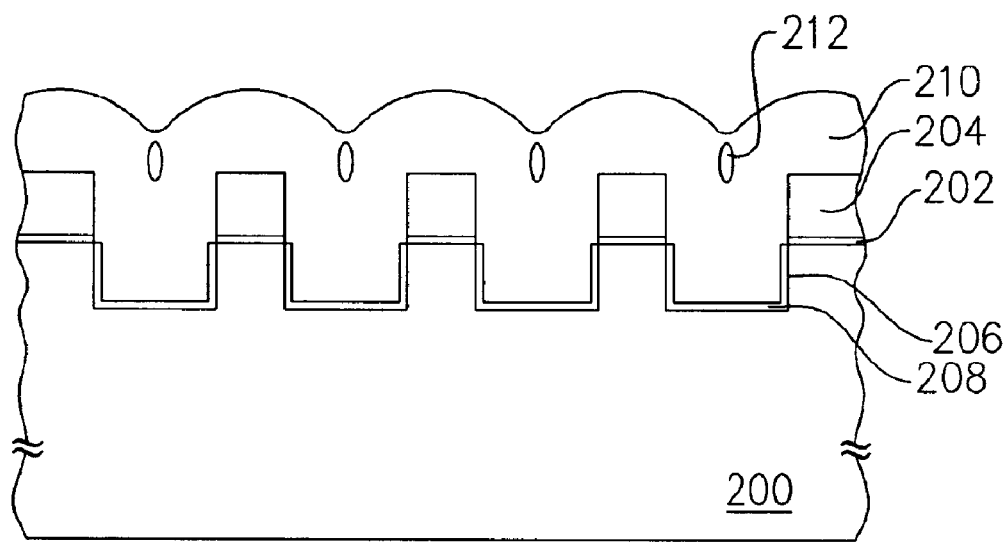
FIGS. 2A through 2D are schematic cross-sectional views showing the steps for fabricating shallow trench isolation structures according to one preferred embodiment of this invention.

FIGS. 2A through 2D are schematic cross-sectional views showing the steps for fabricating shallow trench isolation structures according to one preferred embodiment of this invention. As shown in FIG. 2A, a substrate 200 having a patterned pad oxide layer 202, a mask layer 204 and a plurality of trenches 206 is provided. The pad oxide layer 202 is a silicon oxide layer and the mask layer 204 is a silicon nitride layer, for example. Furthermore, the trenches 206 are formed, for example, by etching the substrate 100 using the patterned mask layer 204 as an etching mask. Thereafter, a liner layer 208 is formed over the trenches 206. The liner layer 208 is, for example, a silicon oxide layer formed by performing a thermal oxidation process.

A dielectric layer 210 is formed over the substrate 200 to fill the trenches 206. The dielectric layer 210 has a plurality of apertures 212 with its top section at a height level higher than the upper surface of the mask layer 204. The dielectric layer 210 is, for example, a silicon oxide layer formed by performing a high-density plasma chemical vapor deposition (HDP-CVD) process. Note that there is no particular restriction on the type of reactive gases or inert gases and the applied bias voltage in the HDP-CVD process as long as the top section of the apertures 212 are set at a level higher than the upper surface of the mask layer 204. In one preferred embodiment, the reactive gases are siline and oxygen and the inert gas is argon.

Figure 2B:
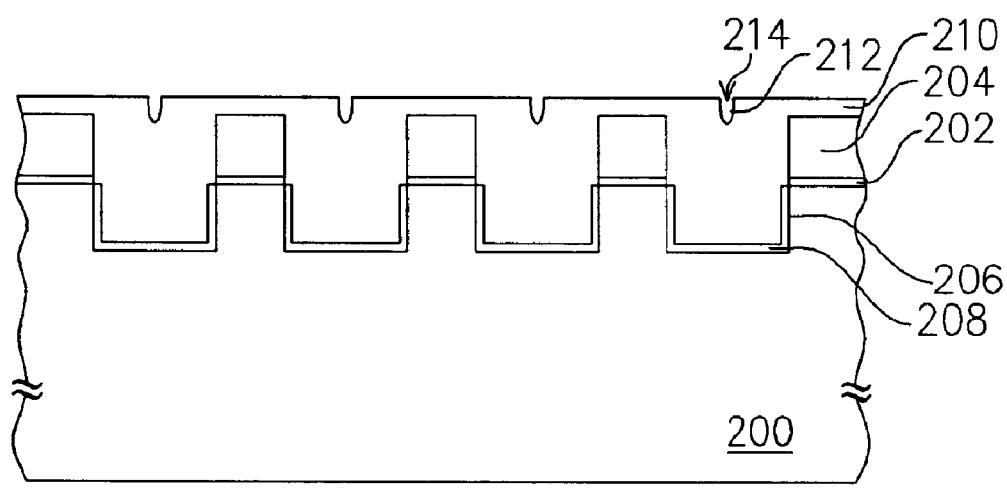

As shown in FIG. 2B, a portion of the dielectric layer 210 is removed to open the apertures 212 and form a plurality of openings 214. The dielectric layer 210 is removed, for example, by performing a chemical/mechanical polishing (CMP) operation. Since the upper section of the apertures 212 remains above the upper surface of the mask layer 204, the apertures 212 are opened in the CMP operation without damaging the mask layer 204.

Figure 2C:
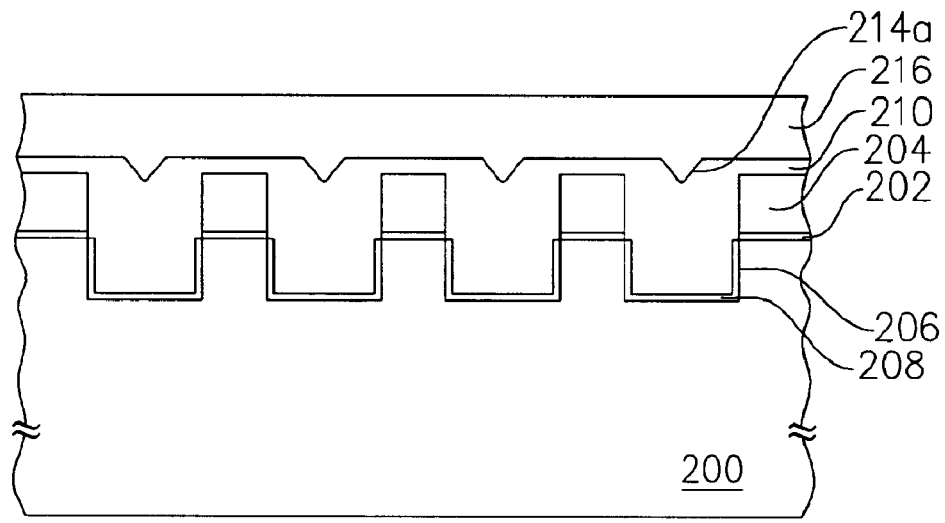

As shown in FIG. 2C, a portion of the dielectric layer 210 on the sidewalls of the openings 214 is removed to increase the width of the openings 214. The sidewall dielectric material is removed, for example, by performing an anisotropic etching process. The anisotropic etching process is a wet etching operation that uses an etchant such as hydrofluoric acid solution. The purpose of increasing the width of the openings 214 to form enlarged openings 214a is to lower the aspect ratio of the openings 214. Thereafter, another dielectric layer 216 is formed over the dielectric layer 210 to fill the openings 214a. The dielectric layer 216 is a silicon oxide layer formed by performing a chemical vapor deposition process using tetraethyl-ortho-silicate (TEOS) as the reactive gas, for example. Note that the dielectric material (the dielectric layer 216) is able to fill the openings 214a completely because the aspect ratio of the openings 214a is reduced.

Figure 2D:
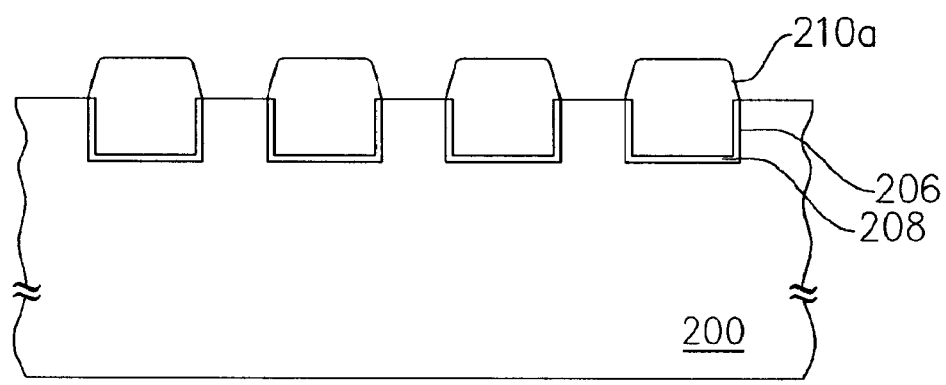

As shown in FIG. 2D, the dielectric material (in the dielectric layer 210 and 216) outside the trenches 206 is removed so that an insulation layer 210a is formed in each trench 206. The excess dielectric material is removed, for example, by performing a chemical/mechanical polishing operation. Thereafter, the pad oxide layer 202 and the mask layer 204 on the substrate 200 are removed to complete the fabrication of shallow trench isolation structures.

In the process of fabricating the shallow trench isolation structures, the apertures 212 inside the dielectric layer 210 are opened up to form openings 214 and these openings 214 are subsequently widened. Thus, when another dielectric layer 216 is formed over the dielectric layer 210, the openings 214a are completely filled to form shallow trench isolation structures that are free of voids.

An actual example is provided to illustrate the sequence of steps needed to fill the intervals completely according to this invention. First, a high-density plasma chemical vapor deposition (HDP-CVD) process is performed to deposit a silicon oxide dielectric layer over the device structures. The HDP-CVD process uses silane and oxygen as the reactive gases. The flow rate of silane is set between 80 and 100 sccm and the flow rate of oxygen is set between 140 and 160 sccm, for example. Furthermore, an inert gas such as argon is also passed during the HDPCVD process. The flow rate of argon is set between 20 and 40 sccm, for example. In addition, the bias voltage for controlling the direction of the plasma is set to a rating between 4200 to 4500 Watts. The aperture is formed at a level higher than the top section of the device structure when the aforementioned parameters is used.

A chemical/mechanical polishing operation is performed to open up the aperture. Because the aperture is higher than the top section of the device structure, the aperture is opened without damaging the device structure.

An anisotropic etching process is performed using hydrofluoric acid solution to enlarge the aperture opening. By increasing the width of the opening through an isotropic etching process, the aspect ratio of the opening is reduced.

A plasma chemical vapor deposition process is performed to form another silicon oxide dielectric layer over the dielectric layer and fill the aperture opening completely. In the plasma deposition process, a reactive gas such as tetraethyl-ortho-silicate (TEOS) is used. Since the aperture opening-has a smaller aspect ratio, the silicon oxide dielectric material can easily settle down inside the opening without forming any voids. In other words, all the intervals between the device structures are solidly filled.

In summary, an actual example is used to show the method of filling intervals according to this invention, in which the formation of voids in the dielectric material that fills the intervals between device structure scan really be avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for filling intervals, comprising the steps of:
   providing a substrate with a plurality of protruding structures thereon, wherein each protruding structure is separated from a neighboring protruding structure by an interval;
   forming a first dielectric layer over the substrate to fill the intervals between the protruding structures and cover the protruding structures, wherein the first dielectric layer has a plurality of apertures positioned at a height level higher than a top section of the protruding structures;
   removing a portion of the first dielectric layer and open up the apertures to form a plurality of openings;
   performing an etching process to increase the width of the openings; and
   forming a second dielectric layer over the first dielectric layer to fill the openings completely.

2. The method of claim 1, wherein the step for forming the first dielectric layer comprises performing a high-density plasma chemical vapor deposition process.

3. The method of claim 1, wherein the protruding structures comprises gate structures.

4. The method of claim 1, wherein the protruding structures comprises conductive line structures.

5. The method of claim 1, wherein the anisotropic etching process comprises a wet etching process performed using a hydrofluoric acid solution as an etchant.

6. The method of claim 1, wherein after providing a substrate but before forming the first dielectric layer over the substrate, further comprises forming a liner layer over the protruding structures and the substrate.

7. The method of claim 1, wherein removing the portion of the first dielectric layer further comprises performing a chemical/mechanical polishing operation.

8. The method of claim 1, wherein the etching process comprises an anisotropic etching operation.

9. A method for forming shallow trench isolation structures, comprising the steps of:
   providing a substrate having a patterned pad oxide layer, a mask layer and a plurality of trenches thereon;
   forming a first dielectric layer over the mask layer to fill the trenches, wherein the first dielectric layer has a plurality of apertures positioned at a height level higher than an upper surface of the mask layer;
   removing a portion of the first dielectric layer to open up the apertures and form a plurality of openings;
   removing a section of the first dielectric layer off the sidewalls of the openings so that a width of the opening is increased;

forming a second dielectric layer over the first dielectric layer to fill the openings completely; and removing the first dielectric layer and the second dielectric layer outside the trenches.

10. The method of claim 9, wherein the step for forming the first dielectric layer comprises performing a high-density plasma chemical vapor deposition process.

11. The method of claim 9, wherein the step for removing a portion of the first dielectric layer comprises performing a chemical/mechanical polishing operation.

12. The method of claim 9, wherein the step for removing a section of the first dielectric layer off the sidewalls of the openings comprises performing an anisotropic etching process.

13. The method of claim 12, wherein the anisotropic etching process comprises a wet etching process performed using a hydrofluoric acid solution as an etchant.

14. The method of claim 9, wherein after providing a substrate but before forming the first dielectric layer over the mask layer, further comprises forming a liner layer over the exposed surface of the trenches.

15. The method of claim 9, wherein after removing the first dielectric layer and the second dielectric layer outside the trenches, further comprises removing the mask layer and the pad oxide layer.

16. A method of filling intervals, comprising the steps of:

providing a substrate having at least a first opening thereon;

forming a first dielectric layer over the substrate to fill the first opening and cover the substrate, wherein the first dielectric layer has at least an aperture located above the opening at a height level higher than an upper surface of the substrate;

removing a portion of the first dielectric layer to open up the aperture and form a second opening;

removing a section of the first dielectric layer off the sidewalls of the second opening to increase a width of the second opening; and forming a second dielectric layer over the first dielectric layer to fill the second opening completely.

17. The method of claim 16, wherein the step for forming the first dielectric layer comprises performing a high-density plasma chemical vapor deposition process.

18. The method of claim 16, wherein the step for removing a portion of the first dielectric layer comprises performing a chemical/mechanical polishing operation.

19. The method of claim 16, wherein the step for removing a section of the first dielectric layer off the sidewalls of the second opening comprises performing an anisotropic etching process.

20. The method of claim 19, wherein the anisotropic etching process comprises a wet etching process performed using a hydrofluoric acid solution as an etchant.

21. The method of claim 16, wherein the first opening comprises an interval between neighboring protruding structures.

22. The method of claim 16, wherein the first opening comprises a trench for forming a shallow trench isolation structure.

* * * * *